United States Patent
Bar-Gadda

(10) Patent No.: US 6,579,805 B1
(45) Date of Patent: Jun. 17, 2003

(54) IN SITU CHEMICAL GENERATOR AND METHOD

(75) Inventor: Ronny Bar-Gadda, Palo Alto, CA (US)

(73) Assignee: Ronal Systems Corp., Mountain View, CA (US)

( * ) Notice: Subject to any disclaimer, the term of this patent is extended or adjusted under 35 U.S.C. 154(b) by 0 days.

(21) Appl. No.: 09/225,922

(22) Filed: Jan. 5, 1999

(51) Int. Cl.$^7$ .............................................. H01L 21/302
(52) U.S. Cl. ........................ 438/710; 438/711; 438/712; 438/729; 438/730
(58) Field of Search .............................. 438/710, 706, 438/711, 712, 729, 730, 715

(56) References Cited

U.S. PATENT DOCUMENTS

| | | | |
|---|---|---|---|
| 3,622,493 A | 11/1971 | Crusco | 422/186.23 |
| 3,625,846 A | 12/1971 | Murdoch et al. | 204/151.45 |
| 3,652,434 A | 3/1972 | Bar-Nun et al. | 204/151.82 |
| 3,657,107 A | 4/1972 | Herriman et al. | 422/186.2 |
| 3,658,673 A | 4/1972 | Kugler et al. | 204/164 |
| 3,869,616 A | 3/1975 | Smars et al. | 422/186.22 |
| 3,919,397 A | 11/1975 | Gould | 423/405 |
| 3,938,988 A | 2/1976 | Othmer | 75/10.21 |
| 3,954,954 A | 5/1976 | Davis et al. | 423/492 |
| 4,145,403 A | 3/1979 | Fey et al. | 423/613 |
| 4,390,405 A * | 6/1983 | Hahn et al. | 204/415 |
| 4,482,525 A | 11/1984 | Chen | |
| 4,812,201 A * | 3/1989 | Sakai et al. | 438/725 |
| 4,812,326 A | 3/1989 | Tsukazaki et al. | |
| 4,883,570 A * | 11/1989 | Efthimion et al. | 204/164 |
| 4,898,748 A | 2/1990 | Kruger, Jr. | |
| 4,926,001 A | 5/1990 | Alagy et al. | |
| 4,973,773 A | 11/1990 | Malone | |
| 5,026,464 A | 6/1991 | Mizuno et al. | |
| 5,338,399 A * | 8/1994 | Yanagida | 216/67 |
| 5,383,984 A * | 1/1995 | Shimada et al. | 156/345.26 |
| 5,403,434 A | 4/1995 | Moslehi | |
| 5,531,973 A | 7/1996 | Sarv | |
| 5,599,425 A | 2/1997 | Lagendijk et al. | |
| 5,607,602 A | 3/1997 | Su et al. | |
| 5,620,559 A | 4/1997 | Kikuchi | |
| 5,652,021 A | 7/1997 | Hunt et al. | |
| 5,665,640 A * | 9/1997 | Foster et al. | 438/680 |
| 5,756,402 A * | 5/1998 | Jimbo et al. | 438/724 |
| 5,853,602 A | 12/1998 | Shoji | |

\* cited by examiner

*Primary Examiner*—Robert Kunemund
*Assistant Examiner*—Binh X. Tran
(74) *Attorney, Agent, or Firm*—Victor H. Okumoto

(57) ABSTRACT

Chemical generator and method for generating a chemical species at a point of use such as the chamber of a reactor in which a workpiece such as a semiconductor wafer is to be processed. The species is generated by creating free radicals, and combining the free radicals to form the chemical species at the point of use.

14 Claims, 1 Drawing Sheet

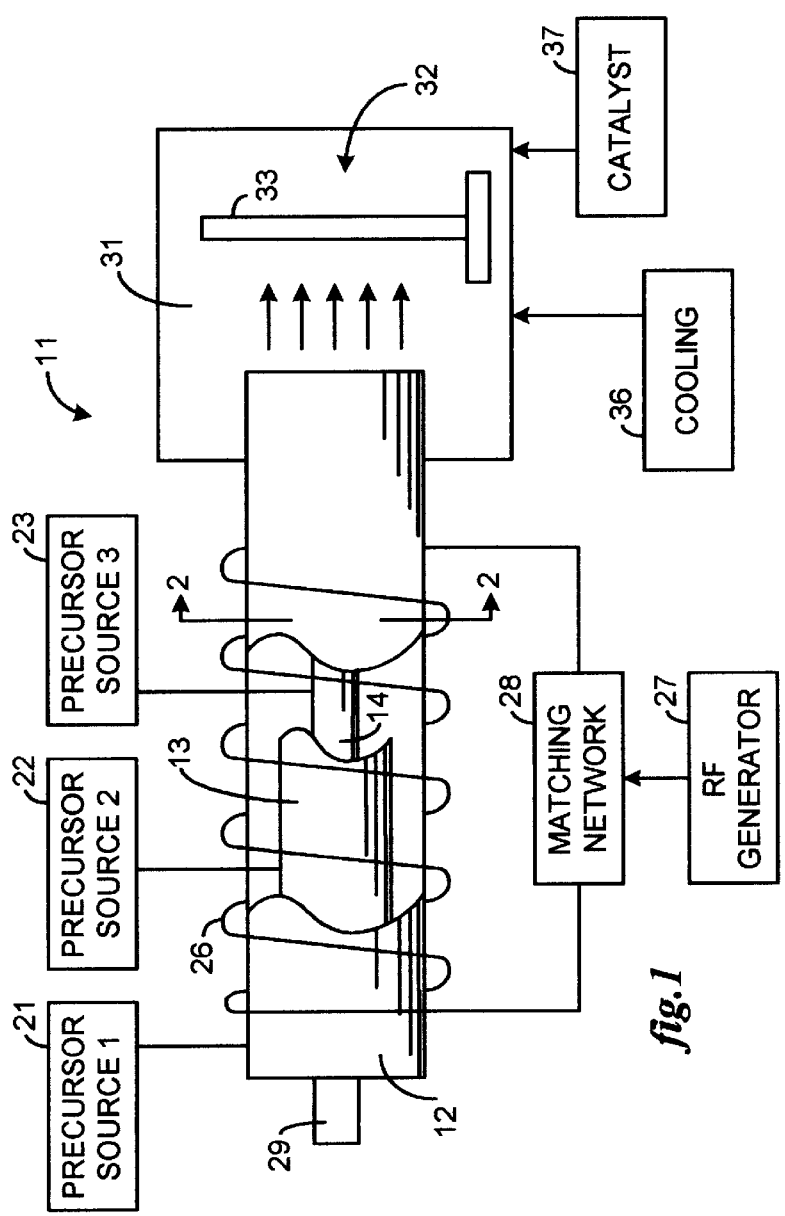

IN SITU CHEMICAL GENERATOR AND METHOD

This invention pertains generally to the fabrication of semiconductor devices and, more particularly, to a method and apparatus for generating important chemical species in the deposition, etching, cleaning, and growth of various materials and layers.

It is in general an object of the invention to provide a new and improved chemical generator and method for generating chemical species at or near the location where they are to be used.

Another object of the invention is to provide a chemical generator and method of the above character which are particularly suitable for generating chemical species for use in the fabrication of semiconductor devices.

These and other objects are achieved in accordance with the invention by providing a chemical generator and method for generating a chemical species at or near a point of use such as the chamber of a reactor in which a workpiece such as a semiconductor wafer is to be processed. The species is generated by creating free radicals, and combining the free radicals to form the chemical species at or near the point of use.

FIG. 1 is a diagrammatic view of one embodiment of an in situ chemical generator incorporating the invention.

FIG. 2 is an enlarged cross-sectional view taken along line 2—2 of FIG. 1.

As illustrated in FIG. 1, the chemical generator includes a free radical source 11 which has one or more chambers in which free radicals are created and delivered for recombination into stable species. In the embodiment illustrated, the source has three chambers which are formed by elongated, concentric tubes 12–14. Those chambers include a first annular chamber 16 between the outermost tube 12 and the middle tube 13, a second annular chamber 17 between middle tube 13 and the innermost tube 14, and a third chamber 18 inside the innermost tube The tubes are fabricated of a material such as ceramic, quartz or metal.

The number of tubes which are required in the generator is dependent upon the chemical species being generated and the reaction by which it is formed, with a separate chamber usually, but not necessarily, being provided for each type of free radical to be used in the process.

Gases or other precursor compounds from which the free radicals are formed are introduced into the chambers from sources 21–23 or by other suitable means. Such precursors can be in gaseous, liquid and/or solid form, or a combination thereof.

A plasma is formed within the one or more chambers to create the free radicals, and in the embodiment illustrated, the means for generating the plasma includes an induction coil 26 disposed concentrically about the one or more tubes, a radio frequency (RF) power generator 27 connected to the coil by a matching network 28, and a Tesla coil 29 for striking an arc to ignite the plasma. The plasma can, however, be formed by any other suitable means such as RF electrodes or microwaves.

Downstream of the tubes, the free radicals are recombined to form the desired species. In the embodiment illustrated, recombination takes place in a chamber 31 which is part of a reactor 32 in which a semiconductor wafer 33 is being processed. Recombination can be promoted by any suitable means such as by cooling 36 and/or by the use of a catalyst 37.

Cooling can be effected in a number of ways, including the circulation of a coolant such as an inert gas, liquid nitrogen, liquid helium or cooled water through tubes or other suitable means in heat exchange relationship with the reacting gases. It can also be effected by passing the gases through an expansion nozzle to lower their temperature, or by the use of either a permanent magnet or an electromagnet to converge and then subsequently expand the plasma to lower its temperature.

A catalyst can be placed either in the cooling zone or downstream of it. It can, for example, be in the form of a thin film deposited on the wall of a chamber or tube through which the reacting gases pass, a gauze placed in the stream of gas, or a packed bed. The important thing is that the catalyst be situated in such a way that all of the gas is able to contact its surface and react with it.

If desired, monitoring equipment such as an optical emission spectrometer can be provided for monitoring parameters such as species profile and steam generation.

In the embodiment illustrated, the chemical generator is part of the reactor, and the species produced is formed in close proximity to the wafer being processed. That is the preferred application of the generator, although it can also be used in stand-alone applications as well. It can be added to existing process reactors as well as being constructed as an integral part of new reactors, or as a stand-alone system.

The generator can be employed in a wide variety of applications for generating different species for use in the fabrication of semiconductor devices, some examples of which are given below.

Oxidation

Steam for use in a wet oxidation process for producing $SiO_2$ according to the reaction

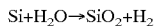

can be generated in accordance with the invention by admitting $H_2$ and $O_2$ into one of the plasma generating chambers. When the plasma is struck, the $H_2$ and $O_2$ react to form steam in close proximity to the silicon wafer. If desired, oxygen admitted alone or with $N_2$ and/or Ar can be used to produce ozone ($O_3$) to lower the temperature for oxidation and/or improve device characteristics.

It is known that the use of NO in the oxidation of silicon with $O_2$ can improve the device characteristics of a transistor by improving the interface between silicon and silicon oxide which functions as a barrier to boron. Conventionally, NO is supplied to the reactor chamber from a source such as a cylinder, and since NO is toxic, special precautions must be taken to avoid leaks in the gas lines which connect the source to the reactor. Also, the purity of the NO gas is a significant factor in the final quality of the interface formed between the silicon and the silicon oxide, but it is difficult to produce extremely pure NO.

With the invention, highly pure NO can be produced at the point of use through the reaction

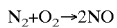

by admitting $N_2$ and $O_2$ to one of the chambers and striking a plasma. When the plasma is struck, the $N_2$ and $O_2$ combine to form NO in close proximity to the wafer. Thus, NO can be produced only when it is needed, and right at the point of use, thereby eliminating the need for expensive and potentially hazardous gas lines.

NO can also be produced by other reactions such as the cracking of a molecule containing only nitrogen and oxygen, such as $N_2O$. The NO is produced by admitting $N_2O$ to the plasma chamber by itself or with $O_2$. If desired, a gas such as Ar can be used as a carrier gas in order to facilitate formation of the plasma.

$N_2O$ can be cracked either by itself or with a small amount of $O_2$ to form $NO_2$, which then dissociates to NO and $O_2$. In rapid thermal processing chambers and diffusion furnaces where temperatures are higher than the temperature for complete dissociation of $NO_2$ to NO and $O_2$ (620° C.), the addition of $NO_2$ will assist in the oxidation of silicon for gate applications where it has been found that nitrogen assists as a barrier for boron diffusion. At temperature below 650° C., a catalyst can be used to promote the conversion of $NO_2$ to NO and $O_2$. If desired, nitric acid can be generated by adding water vapor or additional $H_2$ and $O_2$ in the proper proportions.

Similarly, $NH_3$ and $O_2$ can be combined in the plasma chamber to produce NO and steam at the point of use through the reaction $$NH_3+O_2 \rightarrow NO+H_2O.$$

By using these two reagent gases, the efficacy of NO in the wet oxidation process can be mimicked.

It is often desired to include chlorine in an oxidation process because it has been found to enhance oxidation as well as gettering unwanted foreign contaminants. Using any chlorine source such as TCA or DCE, complete combustion can be achieved in the presence of $O_2$, yielding $HCl+H_2O+CO_2$. Using chlorine alone with $H_2$ and $O_2$ will also yield HCl and $H_2O$.

When TCA or DCE is used in oxidation processes, it is completely oxidized at temperatures above 700° C. to form HCl and carbon dioxide in reactions such as the following:

$$C_2H_3Cl_3+2O_2 \rightarrow 2CO_2+3HCl$$

$$C_2H_2Cl_2+2O_2 \rightarrow 2CO_2+2HCl$$

The HCl is further oxidized in an equilibrium reaction:

$$4HCl+O_2 \rightarrow 2H_2O+Cl_2$$

Decomposition of various organic chlorides with oxygen at elevated temperatures provides chlorine and oxygen-containing reagents for subsequent reactions in, e.g., silicon processing. Such decomposition is generally of the form $$C_xH_yCl_y+xO_2 \rightarrow xCO_2+yHCl,$$

where x and y are typically 2, 3 or 4.

All of the foregoing reactions can be run under either atmospheric or subatmospheric conditions, and the products can be generated with or without a catalyst such as platinum.

The invention can also be employed in the cleaning of quartz tubes for furnaces or in the selective etching or stripping of nitride or polysilicon films from a quartz or silicon oxide layer. This is accomplished by admitting a reactant containing fluorine and chlorine such as a freon gas or liquid, i.e. $C_xH_yF_zCl_q$, where x=1, 2, . . .

y=0, 1, . . .

z=0, 1, . . .

q=0, 1, . . .

and the amount of fluorine is equal to or greater than the amount of chlorine. It is also possible to use a mixture of fluorinated gases (e.g., $CHF_3$, $CF_4$, etc.) and chlorinated liquids (e.g., $CHCl_3$, $CCL_4$, etc.) in a ratio which provides effective stripping of the nitride or polysilicon layer.

Dielectric Films

Other dielectric films can be formed from appropriate precursor gases. Polysilicon can be formed using $SiH_4$ and $H_2$, or silane alone. The silane may be introduced downstream of the generator to avoid nucleation and particle formation.

Silicon nitride can be formed by using $NH_3$ or $N_2$ with silane ($SiH_4$) or one of the higher silanes, e.g. $Si_2H_6$. The silane can be introduced downstream of the generator to avoid nucleation and particle formation.

In addition to gases, the chemical generator is also capable of using liquids and solids as starting materials, so that precursors such as TEOS can be used in the formation of conformal coatings. Ozone and TEOS have been found to be an effective mixture for the deposition of uniform layers.

Metal and Metal Oxide Films

Metal and metal oxide films can be deposited via various precursors in accordance with the invention. For example, $Ta_2O_5$ films which are used extensively in memory devices can be formed by generating a precursor such as $TaCl_5$ via reduction of $TaCl_5$, followed by oxidation of the $TaCl_5$ to form $Ta_2O_5$. In a more general sense, the precursor from which the $Ta_2O_5$ is generated can be expressed as $TaX_m$, where X is a halogen species, and m is the stoichiometric number.

Copper can be deposited as a film or an oxide through the reaction $$CuCl_2+H_2 \rightarrow Cu+HCl,$$

and other metals can be formed in the same way. Instead of a gaseous precursor, a solid precursor such as Cu or another metal can also be used.

Wafer and Chamber Cleaning

With the invention, organic residue from previous process steps can be effectively removed by using $O_2$ to form ozone which is quite effective in the removal of organic contaminants. In addition, reacting $H_2$ with an excess of $O_2$ will produce steam and $O_2$ as well as other oxygen radicals, all of which are effective in eliminating organic residue. The temperature in the chamber should be below about 700° C. if a wafer is present, in order to prevent oxide formation during the cleaning process.

Sulfuric acid, nitric acid and hydrofluoric acid for use in general wafer cleaning are also effectively produced with the invention. Sulfuric acid ($H_2SO_4$) is generated by reacting either S, SO or $SO_2$ with $H_2$ and $O_2$ in accordance with reaction such as the following:

$$S+2.5O_2+2H_2 \rightarrow H_2SO_4+H_2O$$

$$SO+1.5O_2+H_2 \rightarrow H_2SO_4$$

$$SO_2+1.5O_2+2H_2 \rightarrow H_2SO_4+H_2O$$

then quickly quenching the free radicals thus formed with or without a catalyst.

Nitric acid ($HNO_3$) is generated by reacting $NH_3$ with $H_2$ and $O_2$, or by a reaction such as the following:

$$N_2+3.5O_2+H_2 \rightarrow 2HNO_3+H_2O$$

$$NH_3+2O_2 \rightarrow 2HNO_3+H_2O$$

Hydrofluoric acid is generated by co-reacting $H_2$ and $O_2$ with a compound containing fluorine such as $NF_3$ or $C_xH_yF_z$, where $x = 1, 2, \ldots$ $y = 0, 1, \ldots$ $z = 1, 2, \ldots$ Mixed acids can be generated from a single precursor by reactions such as the following:

$SF_6 + 4H_2 + 2O_2 \rightarrow H_2SO_4 + 6HF$ $NH_2 + H_2 + 1.5O_2 \rightarrow HNO_3 + HF$ $2NHF + H_2 + 3O_2 \rightarrow 2HNO_3 + 2HF$ $NF_3O + 2H_2 + O_2 \rightarrow HNO_3 + 3HF$ $NF_2Cl + 2H_2 + 1.5O_2 \rightarrow HNO_3 + 2HF + HCl$ $N_2F_4 + 3H_2 + 3O_2 \rightarrow 2HNO_3 + 4HF$ $N_2F_4 + 2H_2 + 3O_2 \rightarrow 2HNO_3 + 2HF$ $NF_3 + 2H_2 + 1.5O_2 \rightarrow HNO_3 + 3HF$ $NF_2 + 1.5H_2 + 1.5O_2 \rightarrow HNO_3 + 2HF$ $NF + H_2 + 1.5O_2 \rightarrow HNO_3 + HF$ $NS + 1.5H_2 + 3.5O_2 \rightarrow HNO_3 + H_2SO_4$ $2N_2OF + 2H_2 + O_2 \rightarrow 2HNO_3 + 2HF$ $NOF_3 + 2H_2 + O_2 \rightarrow HNO_3 + 3HF$ $NOF + H_2 + O_2 \rightarrow HNO_3 + HF$ $NOCl + H_2 + O_2 \rightarrow HNO_3 + HCl$ $NOBr + H_2 + O_2 \rightarrow HNO_3 + HBr$ $NO_2Cl + 2H_2 + O_2 \rightarrow 2HNO_3 + HCl$ $S_2F_{10} + 7H_2 + 4O_2 \rightarrow H_2SO_4 + 10HF$ $S_2F_2 + 3H_2 + 4O_2 \rightarrow H_2SO_4 + 2HF$ $SF + 1.5H_2 + 2O_2 \rightarrow H_2SO_4 + HF$ $SF_2 + 2H_2 + 2O_2 \rightarrow H_2SO_4 + 2HF$ $SF_3 + 2.5H_2 + 2O_2 \rightarrow H_2SO_4 + 3HF$ $SF_4 + 3H_2 + 2O_2 \rightarrow H_2SO_4 + 4HF$ $SF_5 + 3.5H_2 + 2O_2 \rightarrow H_2SO_4 + 5HF$ $SF_6 + 4H_2 + 2O_2 \rightarrow H_2SO_4 + 6HF$ $SBrF_5 + 4H_2 + 2O_2 \rightarrow H_2SO_4 + 5HF + HBr$ $S_2Br_2 + 3H_2 + 4O_2 \rightarrow 2H_2SO_4 + 2HBr$ $SBr_2 + 2H_2 + 2O_2 \rightarrow H_2SO_4 + 2HBr$ $SO_2F_2 + 2H_2 + O_2 \rightarrow H_2SO_4 + 2HF$ $SOF_4 + 3H_2 + 1.5O_2 \rightarrow H_2SO_4 + 4HF$ $SOF_2 + 2H_2 + 1.5O_2 \rightarrow H_2SO_4 + 2HF$ $SOF + 1.5H_2 + 1.5O_2 \rightarrow H_2SO_4 + HF$ $SO_2ClF + 2H_2 + O_2 \rightarrow H_2SO_4 + HF + HCl$ $SOCl_2 + 2H_2 + 1.5O_2 \rightarrow H_2SO_4 + 2HCl$ $SOCl + 1.5H_2 + 1.5O_2 \rightarrow H_2SO_4 + HCl$ $SOBr_2 + 2H_2 + 1.5O_2 \rightarrow H_2SO_4 + 2HBrCl$ $SF_2Cl + 2.5H_2 + 2O_2 \rightarrow H_2SO_4 + 2HF + HCl$ $SClF_5 + 4H_2 + 2O_2 \rightarrow H_2SO_4 + 5HF + HCl$ $SO_2Cl_2 + 2H_2 + O_2 \rightarrow H_2SO_4 + 2HCl$ $S_2Cl + 2.5H_2 + 4O_2 \rightarrow 2H_2SO_4 + HCl$ $SCl_2 + 2H_2 + 2O_2 \rightarrow H_2SO_4 + 2HCl$ These are but a few examples of the many reactions by which mixed acids can be generated in accordance with the invention. Including more $H_2$ and $O_2$ in the reactions will allow steam to be generated in addition to the mixtures of acids.

In order to devolitize the various resultant products of the reaction of HCl, HF, $H_2SO_4$ or $HNO_3$, either $H_2O$ or $H_2$ and $O_2$ can be co-injected to form steam so that the solvating action of water will disperse in solution in the products. The temperature of the water must be cool enough so that a thin film of water will condense on the wafer surface. Raising the temperature of the water will evaporate the water solution, and spinning the wafer will further assist in the removal process.

Native Oxide Removal

The native oxide which is ever present when a silicon wafer is exposed to the atmosphere can be selectively eliminated by a combination of HF and steam formed by adding a fluorine source such as $NF_3$ or $CF_4$ to the reagent gases $H_2$ and $O_2$. In order for the native oxide elimination to be most effective, the reaction chamber should be maintained at a pressure below one atmosphere.

Photoresist Stripping $H_2$ and $O_2$ can also be reacted to form steam for use in the stripping of photoresist which is commonly used in patterning of silicon wafers in the manufacture of integrated circuits. In addition, other components such as HF, $H_2SO_4$ and $HNO_3$ which are also generated with the invention can be used in varying combinations with the steam to effectively remove photoresist from the wafer surface. Hard implanted photoresist as well as residues in vias can also be removed with steam in combination with these acids.

$SO_3$ for use in the stripping of organic photoresist can be generated by adding $O_2$ to $SO_2$. Similarly, as discussed above, $N_2O$ can be converted to $NO_2$, a strong oxidizing agent which can also be used in the stripping of photoresist.

Hydrofluoric acid for use in the stripping of photoresist can be generated in situ in accordance with any of the following reactions:

$CF_4 + 2H_2 + O_2 \rightarrow CO_2 + 4HF$ $CF_4 + 1.5O_2 + 3H_2 \rightarrow CO_2 + 4HF + H_2O$ $NF_3 + O_2 + 5H_2 \rightarrow N_2 + 6HF + 2H_2O$ It is apparent from the foregoing that a new and improved chemical generator and method have been provided. While only certain presently preferred embodiments have been described in detail, as will be apparent to those familiar with the art, certain changes and modifications can be made without departing from the scope of the invention as defined by the following claims.

What is claimed is:

1. In a method of generating predetermined chemical species for use in processing semiconductor wafers, the steps of: introducing a plurality of precursor materials into different processing chambers in a chemical generator, forming ionized gas plasmas in the processing chambers to create free radicals from the precursor materials, and combining the free radicals to form the predetermined chemical species in close proximity to the wafer, the precursor materials being selected to produce all of the free radicals needed to form the predetermined chemical species.

2. The method of claim 1 wherein the plasma are formed within and between a plurality of elongated, concentric tubes which define the processing chambers.

3. The method of claim 1 wherein the plasmas are formed in a field created by applying RF power to an induction coil disposed concentrically around the tubes.

4. The method of claim 1 wherein the step of combining the free radicals includes the step of quickly cooling the free radicals to promote formation of the predetermined chemical species.

5. The method of claim 1 wherein the step of combining the free radicals includes use of a catalyst which promotes combination of the free radicals and formation of the predetermined chemical species.

6. In a method of generating a predetermined chemical species, the steps of: introducing a plurality of precursor materials into different processing chambers in a chemical generator, forming ionized gas plasmas in the processing chambers to create free radicals from the precursor materials, and combining the free radicals to form the predetermined chemical species, the precursor materials being selected to produce all of the free radicals needed to form the predetermined chemical species.

7. The method of claim 6 wherein the plasmas are formed in a plurality of elongated concentric tubes which define the processing chambers.

8. The method of claim 1 wherein the plasmas are formed in a field created by applying RF power to an induction coil disposed concentrically about the elongated, concentric tubes.

9. The method of claim 6 wherein the step of combining the free radicals includes the step of quickly cooling the free radicals to promote formation of the predetermined chemical species.

10. The method of claim 6 wherein the step of combining the free radicals includes use of a catalyst which promotes combination of the free radicals and formation of the predetermined chemical species.

11. In a method of generating a predetermined chemical species, the steps of: introducing a first precursor material into a chamber formed within a first elongated tube, introducing a second precursor material into a chamber formed between the first elongated tube and a second elongated tube disposed concentrically of the first, applying RF power to an induction coil disposed concentrically about the tubes to ionize the precursor materials passing through the chambers and thereby form gas plasmas containing free radicals, and combining the free radicals downstream of the chambers to form the predetermined chemical species.

12. In a method of generating a predetermined chemical species, the steps of: introducing a first precursor material into a first processing chamber, introducing a second precursor material into a second processing chamber, forming an ionized gas plasma in each of the processing chambers to produce free radicals from the precursor materials, and combining the free radicals with each other and with a molecular species to form the predetermined chemical species.

13. In a method of generating a predetermined chemical species, the steps of: introducing a first precursor material into a chamber formed within a first elongated tube, introducing a second precursor material into a chamber formed between the first elongated tube and a second elongated tube disposed concentrically about the first elongated tube, forming ionized gas plasmas in the chambers to produce free radicals from the precursor materials, and cooling the free radicals as they emerge from the chambers to promote combination of the free radicals to form the predetermined chemical species.

14. The method of claim 13 wherein the precursor materials are selected to produce all of the free radicals needed to form the predetermined chemical species.

* * * * *